United States Patent
McArdle et al.

(10) Patent No.: US 6,423,172 B1
(45) Date of Patent: Jul. 23, 2002

(54) METHOD OF FORMING A COATING ONTO A NON-RANDOM MONOLAYER OF PARTICLES, AND PRODUCTS FORMED THEREBY

(75) Inventors: Ciaran McArdle; Rory B. Barnes, both of Dublin (IE)

(73) Assignee: Loctite (R&D) Limited, Dublin (IR)

(*) Notice: Subject to any disclaimer, the term of this patent is extended or adjusted under 35 U.S.C. 154(b) by 0 days.

(21) Appl. No.: 09/582,628

(22) PCT Filed: Jan. 29, 1999

(86) PCT No.: PCT/US99/01472
§ 371 (c)(1),
(2), (4) Date: Jul. 7, 2000

(87) PCT Pub. No.: WO99/38623
PCT Pub. Date: Aug. 5, 1999

Related U.S. Application Data

(60) Provisional application No. 60/073,104, filed on Jan. 30, 1998.

(51) Int. Cl.⁷ ............................................. B32B 32/00
(52) U.S. Cl. ........................... 156/272.2; 156/275.5; 156/272.4; 156/305
(58) Field of Search .................. 156/333, 275.5, 156/272.4, 273.9, 275.7, 305, 272.2; 252/62.62

(56) References Cited

U.S. PATENT DOCUMENTS

| | | | | |
|---|---|---|---|---|
| 3,917,538 A | * | 11/1975 | Rosenweig | 252/62.51 |
| 4,092,376 A | * | 5/1978 | Douek et al. | 260/884 |
| 4,100,085 A | * | 7/1978 | Haas et al. | 252/62.52 |
| 5,769,996 A | | 6/1998 | McArdle et al. | 156/272.4 |
| 5,851,644 A | | 12/1998 | McArdle et al. | 428/213 |

* cited by examiner

Primary Examiner—Merrick Dixon
(74) Attorney, Agent, or Firm—Steven C. Bauman

(57) ABSTRACT

The present invention provides a variety of interrelated methods of coating non-random and ordered arrays of particles, as well as films containing such arrays. The present invention also relates to the coated non-random and ordered arrays of particles and films prepared therefrom. The coated non-random and ordered arrays are obtained by the use of ferrofluid compositions which may be curable. The arrays and films may contain electrically-conductive particles useful in electronic applications for effecting contact between conductors.

16 Claims, 1 Drawing Sheet

METHOD OF FORMING A COATING ONTO A NON-RANDOM MONOLAYER OF PARTICLES, AND PRODUCTS FORMED THEREBY

This application claims priority from provisional application Ser. No. 60/073,104, filed Jan. 30, 1998.

BACKGROUND OF THE INVENTION

1. Field of the Invention

This invention relates to a method of coating particles as well as a method of forming a coating onto an array monolayer of particles, which may be in an adhesive form or previously formed onto a film, and products formed thereby. Such adhesives and films whose uniformly separated particles have now been coated with a conductive interconnection material, such as solder, possess anisotropic conductive pathways and enhanced interconnective capabilities, which are particularly attractive in many commercial applications, such as in the electronics industry.

2. Description of Related Technology

The advent of miniaturized electronics devices has spurred the development of numerous techniques and devices for electrical interconnection, many of which use regular-shaped metallic particles in the assembly process.

The trend towards miniaturized ball grid arrays ("BGA") was initiated in the 1960's by International Business Machines Corporation ("IBM") through its controlled collapse chip connection process ("the C4 process"). The C4 process initially used arrays of highly regular copper microspheres—of about 1000 microns in diameter—which were subsequently electrodelessly plated with nickel and then with gold [see U.S. Pat. No. 3,303,393 (Hymes) and P. A. Totta and R. P. Sopher, *IBM J. Res. Devel.*, 226 (1969)].

Microsphere development for BGA and so-called $\mu$BGA now seeks such spheres with diameters as small as 100 microns, and accurate control of particle diameter distribution (or dispersity). Surface tension properties of molten metals and alloys have been recognized in the production of regular solid gold and solid solder microspheres with narrow spreads of particle diameters [see K. Tatsumi, et al., Int'l Pack'g Strategy Symp. '96, 4-1, Kudan Kaikkan Japan (1996)]. Attachment of gold spheres of such diameters to specific locations on substrates often requires attraction of the particles onto a template of undersized holes (relative to the sphere diameter), with subsequent alignment onto the substrate electrode pattern achieved using a vision system. The gold spheres themselves are bonded to the substrate by thermocompression; in contrast, solder particles are attached to previously-fluxed electrode substrates.

The microelectronics industry has moved generally from conventional surface mount technology ("SMT"), which uses packaged integrated circuits ("IC") with peripheral pin-type connections, to more advanced, yet well-known, technologies, such as BGA, chip scale or chip size packaging ("CSP"), and now direct chip attachment ("DCA") or flip chip ("FC").

CSP uses compact arrays of connection (i.e., inputs/outputs or "i/o") to connect to the IC, BGAs or pin grid arrays ("PGA"), depending upon whether the i/o's have metal spheres or metal pins for connectors. For miniaturized electronics devices, CSP enables higher densities of interconnection in smaller spaces than SMT. The resulting devices can thus be made thinner and more compatible with tape-based manufacturing methods, similar to those developed for tape automated bonding ("TAB") technologies.

DCA, or FC, involves direct attachment of the bare IC face down on the substrate. In certain situations, FC uses microscopic solder joints to mediate electrical currents to and from the IC and the board. The solder is reflowed onto metalised bumps already built up on the chip during the fabrication processes—of course, in many instances thermocompressed gold joints may be used in place of the reflowed solder.

Chips attached to ICs by such microscopic joints should maintain or enhance the integrity of their attachment by underfilling the space beneath the chip (which is not occupied by discrete microsolder joints) with a durable adhesive (applied in a liquid form), which is wicked in under the chip and subsequently cured to a durable solid. The so-formed solid serves to bond the chip to the board and protect the microscopic electrical interconnections. Without such an underfill sealant, chips attached by DCA or FC tend to exhibit a higher rate of failure.

Anisotropically conductive adhesives ("ACA") and anisotropically conductive adhesive films ("ACF") are well-known for their use with electronic device, such as FC, interconnection. [See J. H. Lau, Flip Chip Technologies, McGraw-Hill, NY, Ch. 8–10 (1995), and International Patent Application WO 95/20820, the disclosures of each of which are expressly incorporated herein by reference.] Of course, with ACA/ACF technology underfill sealants are no longer necessary to provide the added benefits of chip bonding, sealing and shock absorbing properties to which reference is made above.

ACAs and ACFs are loaded (at about a 10% wt/wt level) during their formulations or fabrication with conductive fillers. These fillers are typically compliant crosslinked polymer microspheres coated first with nickel and then with gold, or simply with a nickel coating. The latter can further be subjected to electrodeless plating of metals such as copper, palladium, platinum, and the like. These spheres are manufactured commercially in a range of sizes, but within each size range the particle diameter is precise, varying only by fractions of a micron (and accordingly may be considered "monodisperse"). However, such spheres are not available commercially with a further coating of a material such as solder.

Metal-coated polymer spheres offer advantages over solid metal spheres with regard to the control of diameter range and accuracy, as well as the compliant nature of the sphere and control of such compliance.

The ability to control sphere diameter with high precision in these products is a consequence of the way in which they are manufactured. Typically, the spheres are grown from a polymer seed, with the growth reaction being terminated precisely thereby controlling the particle geometries through the propagation of units at the molecular level. Such polymer spheres are then subjected to chemical processes to enhance adhesion of a thin metal seed coating (ordinarily, nickel) deposited by electrodeless plating. Gold is subsequently electrodelessly plated over the nickel seed layer. Electrodeless plating typically deposits metal layers up to about 500 Å in thickness; it is not a commercially practical method for metal coating deposition of any significant thickness. In addition, to date, it is not believed that solder or resinous materials may be coated onto such spheres in a commercially practical manner by electrodeless techniques.

Other approaches to enhancing polymer particle conductivity include doping their core material with conductive materials, such as silver filled thermoplastic resins. [See U.S. Pat. No. 5,531,942, (Gilleo).] The melting point of metal alloys is much higher than for thermoplastic resins; hence, the thermal performance of electronic devices using solder interconnection materials is superior to electronic devices using metal-filled thermoplastics, particularly in more demanding applications.

Arrays of solder-tipped metal conductors are known. [See U.S. Pat. No. 5,681,647 (Caillat).] However, the system described in the '647 patent is produced by a complex process involving cathodic sputtering of metals, multilayer film depositions, lithography and electroplating. Such a complex process is likely to be commercially unattractive at least because of the many process steps, and the choice of available chemistry is limited due to thermal sensitivity of the so-described process.

There are, however, disadvantages of metal-coated polymer spheres, including their typical limited current carrying capability by virtue of the small quantity of conductive material present. The metals traditionally used to coat the surface of polymer spheres are not fusible, and hence cannot wet substrate metalisations to make efficient joints. While low current carrying capabilities in particles bearing thin metal coats may be circumvented by increasing particle density, a better solution would be a more substantial layer of conductor overcoating the particle. A coating of a fusible metal alloy, such as solder, would be better still.

There is large commercial demand for metal-coated spheres in electronic applications, such as BGA, as all major microelectronic device manufacturers have some version of BGA-based devices. It is believed that this demand would further increase and extend in the event smaller, monodisperse spheres could be manufactured with a fusible metal surface.

Thus, it would be desirable for a particle to possess the advantages of a metal-coated polymer sphere, as well as conductive properties and other properties such as fusibility of the metal coating.

Despite the state-of-the-art, it would be desirable to provide coated microparticles, as well as enhance the interconnective capability of particles used in ACA/ACF technology.

SUMMARY OF THE INVENTION

The present invention provides methods of forming a coating onto a monolayer of particles, and products formed thereby.

This invention also provides methods for forming a coating onto arrayed monolayers of particles, which particle arrays are maintained in place by use of a cured tack layer. These methods employ a curable matrix in which the particles are dispersed and the curable matrix is cured partially through the liquid film to form a thin solid film. The so-formed thin film maintains the particles in place, but does not substantially encase the particles. Accordingly, the particles (now maintained in place) are ripe for coating with an appropriate material of choice.

The present invention also provides methods for producing films from such coated particle-containing curable matrices, where the particles are maintained and contained within an additional film. In these methods, the monolayers of particles are backfilled with a film-forming material which substantially encases and securely maintains in place the particles.

By the methods of the present invention, coated polymer particles of precise diameter are produced by a simple process where the particles are isolated from one another in one substrate plane and form a non-random distribution pattern in that plane. In a particularly desirable aspect of the methods of this invention, wave solder coating of existing metal-coated polymer spheres is achieved in a process which is made possible by the initial separation of the particles in a uniform manner which enables individual particle coating with minimum interparticle bridging by the coating material. In the methods of the invention, desirable topographies may be produced on the particles, such as spikes, in a facile on-line process. Such topographies may be particularly useful in achieving advantageous interconnective properties, which are likely to be commercially desirable in at least the electronics industry.

Accordingly, the present invention is advantageous as it provides methods of coating particles, particularly microparticles, with a material, such as solder, which otherwise would be impractical, leaving the products formed by this invention unattained. Thus, through the material coating methods of this invention, the surface properties of monolayers of such particles are modified, rendering the particles more versatile for existing and new electronic applications, such as in CSP and FC technologies.

That is, this invention is directed to an on-line method of coating the surface of individual microparticles (whose diameters range from about 5 microns up to about 1000 microns) with a variety of coating materials. The thickness and surface topology of the chosen coating material may be controlled using the methods of this invention. Indeed, the methods of this invention may coat particles with a variety of materials in an on-line, rapid, continuous and facile manner.

The invention will be more fully understood by a reading of the "Detailed Description of the Invention" together with the drawing.

DETAILED DESCRIPTION OF THE INVENTION

Figure 1:
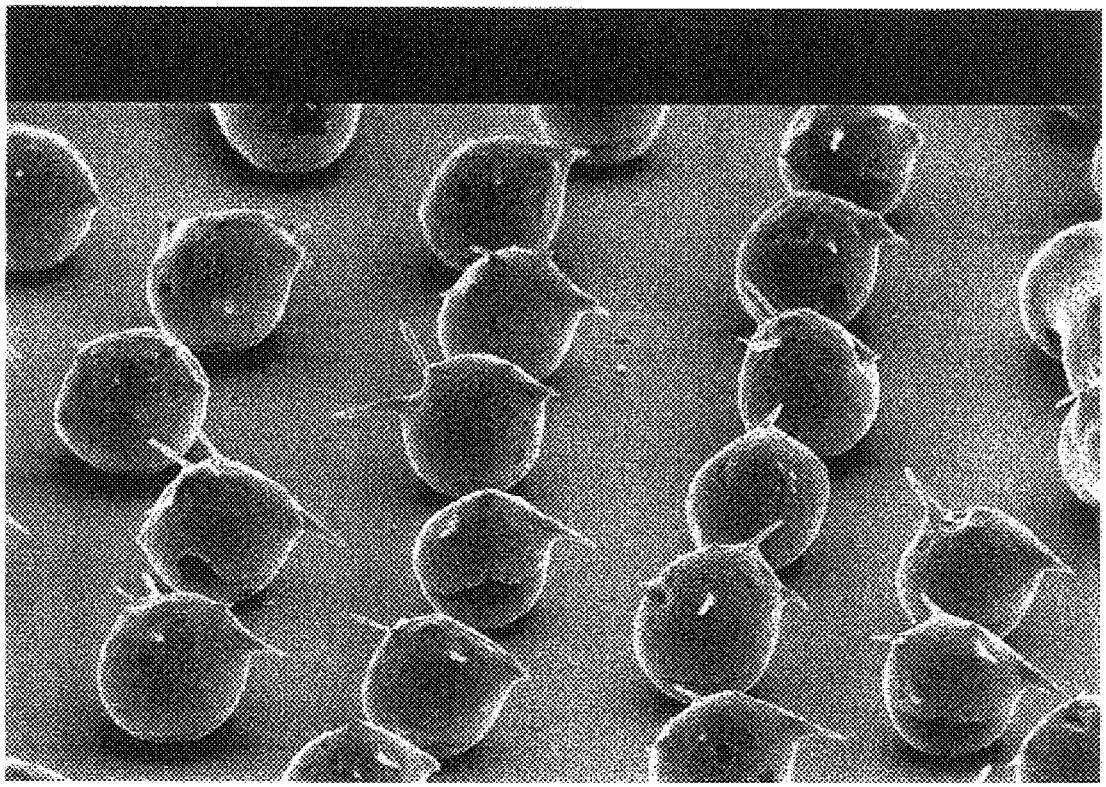
FIG. 1 is an electron micrograph at ×750 showing the surface topology of individually separated 18 micron gold-coated polymer spheres, which have been subsequently coated with tin-lead solder in accordance with methods of the present invention.

Broadly, the present invention relates to methods of modifying the surface of particles to render the so-modified particles more versatile, particularly in applications for the electronics industry, such as with CSP and FC technologies.

That is, this invention is directed to an on-line method of coating the surface on individual microparticles (whose diameters range from about 5 microns up to about 1000 microns) with a variety of coating materials. The thickness and surface topology of the chosen coating material may be controlled using the methods of this invention.

More specifically, this invention relates to a method of coating substantive particles, the steps of which include:

(a) applying a curable ferrofluid composition to a substrate so as to form a film with a thickness of less than two substantive particle diameters. The curable ferrofluid composition includes:
   (i) a colloidal suspension of ferromagnetic particles in a non-magnetic carrier liquid, and
   (ii) substantive particles;

(b) subjecting the film of (a) to a magnetic field for a time sufficient to arrange the substantive particles in the film in a non-random pattern;

(c) exposing the magnetic field-stimulated film of (b) to conditions favorable to at least cure partially the film and bond the substantive particles to the substrate;

(d) removing uncured curable ferrofluid composition; and (e) subjecting the bound non-random substantive particles to a coating material under conditions favorable to effect coating of the substantive particles.

In one aspect of this invention, a method of forming a coating onto a monolayer non-random array of particles is provided. This method includes the steps of applying to a substrate a curable ferrofluid composition containing particles having a particle size on at least one dimension thereof of at least 1 micrometre; subjecting the particle-containing curable ferrofluid composition to a magnetic field for a sufficient time to array the particles in a non-random manner in the composition; and exposing the composition having the particles arrayed therein to a source of energy suitable for effecting polymerization of the curable ferrofluid composition for a sufficient time to effect polymerization of a layer of the curable ferrofluid composition having a thickness of no more than about 50% of the height of the largest particles; removing the uncured ferrofluid composition, if any remains; and subjecting the bound non-random substantive particles to a material under conditions favorable to effect coating of the substantive particles.

In another aspect of this invention, in the method described above, during exposure of the curable composition to the source of energy, a mask may be positioned between the energy source and the curable composition. The mask should have certain areas which allow for the passage of energy and other areas which block the passage of energy.

Alternatively, the substrate upon which the curable composition or curable ferrofluid composition, as appropriate, is applied may have areas that allow for the passage of the energy and areas that block passage of the energy. Accordingly, the substrate itself may act as a mask when the source of the energy is on the opposite side of the substrate to the curable composition.

In accordance with the present invention, the curable composition (or curable ferrofluid composition) may be applied to the substrate in a pattern, for example by screen or stencil printing, or by conventional coating techniques.

The particles employed in the present invention ("the substantive particles") should have a particle size of at least one micrometer on at least one dimension thereof.

By the methods of this invention, the substantive particles should be arrayed in a regular pattern in a monolayer. This regular pattern may be termed non-random, and desirably is an ordered array.

The substantive particles should be conductive particles, such as electrically-conductive particles like metallic particles or metal-coated particles. A variety of particle types and shapes may be used in the present invention.

Since the type of metal used in microelectronic device interconnection varies greatly according to the type of device, desired performance, type of substrate, manufacturing process, and the like, a variety of metals have found uses in interconnection devices.

For instance, metals, such as gold, copper, platinum, and like, or metal alloys, such as the numerous commercially available solder types, are well-suited in this regard. Combinations of metals and metal alloys with organic materials have also been widely used, for example, in conductive adhesive interconnection materials. The metallic fillers in such materials may also be solid pure metals, alloys, metal-coated polymer spheres, or regular polymer particles with conductive metal particles dispersed within individual particles.

A desirable type of particle which may be coated in accordance with the methods of this invention are available commercially from Sekisui KK (Japan) under the tradename MICROPEARL and Dyno A.S. (Norway) under the tradename DYNOSPHERES. One particularly desirable type of particle is the gold-coated spherical polystyrene particle supplied by Sekisui Fine Chemical Co, Osaka, Japan under the tradename AU 212. These particles are reported to have an average diameter of 11.5 micrometres when compressed on the Z-axis under 3.3 MPa pressure and demonstrated a Z-axis dimension of 10.5 micrometres, i.e., an aspect ratio (Z/X) of 0.79 corresponding to an 8.7% contraction on the Z-axis.

Those persons of skill in the art should recognize the far flung opportunities offered by the present invention beyond those expressly set forth herein, and accordingly should choose appropriate particles for the intended result, e.g., carbon, carbon black, alumina, zinc oxide, magnesium oxide, ferric oxide and ceramic materials as a core onto the surface of which is coated an appropriate metallic surface; and silver, copper, gold, nickel and the like for electric conductivity. Alloys may also be used as electrically conductive particles.

For electronic applications, the particles should be electrically conductive and substantially non-magnetic.

The term non-magnetic as used herein means that each particle has no significant net magnetic dipole. A particle with a "non-magnetic" core may have a coating of a metal (such as, nickel), which is ferromagnetic in nature. But in view of the small volume of the coating, the net magnetic moment per unit volume of the particle is not significant. The substantially non-magnetic particles do not typically respond to magnetic fields in environments which themselves are not susceptible to magnetic fields, such as a non-ferromagnetic liquid medium. Suitable particles may be constructed entirely of conductive materials; or they may have a non-magnetic non-conductive core, such as of a thermoplastic material like polystyrene, or of glass, coated with an electrically-conductive metal like nickel, silver or gold. A core of conductive material, such as graphite or a metal, may also be used. The core may optionally be hollow, such as a hollow glass sphere with an outer coating of a conductive material. Particles of carbon fibre may also be used.

The particles desirably should have a particle size in the range of about 1 to about 300 micrometres. Spherical particles are desirable but other spheroidal shapes, elongated shapes, cylindrical shapes, regular shapes, such as cubic or fibrous structures, may also be used. For spherical particles, a diameter in the range of about 2 to about 100 micrometres is desirable, such as about 2 to about 50 micrometres, particularly about 5 to about 30 micrometres or about 5 to about 20 micrometres.

For particles having a major dimension and a minor dimension, the major dimension is desirably in the range of about 2 to about 300 micrometres and the minor dimension is desirably in the range of about 2 to about 100 micrometres, such as 2–50 micrometres, particularly 5–30 micrometres, or 5–20 micrometres, with the aspect ratio being in the range of about 15/1 to about 1/1, more particularly 10/1 to 1/1.

In the case of fibrous structures, an aspect ratio of up to about 50/1 may be acceptable. If used, fibres should be of substantially uniform length (e.g., in the form of cylinders) and arrayed so that their long axes are orthogonal to the substrate.

The largest particles (the substantive particles) are monodisperse, ordinarily having a diameter of at least 2 micrometers. Alternatively, particles of two or more groups of different sizes but of substantially uniform size within the group of larger size may be used. In accordance with the present invention, the curable composition may also contain one or more fillers having a particle size in the range 0.1 to about 1 micrometers.

In the methods described herein, the depth of penetration of the particles into the adhesive film is ordinarily no greater than about 25%, desirably about 10%, of the height of the largest particles, i.e., the dimension perpendicular to the plane of the adhesive film.

When the particles are of substantially uniform size, the height of the cured layer is measured in relation to the average diameter of the particles. When the term "diameter" is used herein in relation to non-spherical particles, it refers to the dimension perpendicular to the substrate.

The material used as a coating for the arrayed particles may be fusible metal alloys generally, with solders being particularly desirable, and any other materials capable of liquifying at temperatures greater than about 150° C., such as thermoplasts, relative hot melt, epoxies, cyanate esters, polyimides, polamides, polyesters, and appropriate combinations thereof.

Solid solder monospheres with easily controlled diameters having diameter variation of fractions of a micron and availability in a range of sizes are not commercially available. Even if such particles were available, they would be difficult to array in a highly uniform manner due to the high density of such metal alloys which are commonly lead based. The high density of solid solder particles would render said particles prone to precipitation in the curable ferrofluid compositions, particularly those compositions of low viscosity (typically 100 cps or less at room temperature) used in the invention.

With respect to a solder coating process for the substantive particles, the solder coating process may be controlled so as to form a substantially uniform coating of solder on the surface of the particles or a spiked topography resulting from the relative movement of the substrate to which the arrayed particle pattern is bound to the solder wave and the rate at which the coated particles cool to room temperature after transversing the wave.

That is, retro-coating with solder previously-separated metal-coated spheres circumvents this problem. The initial array of particles is first established, in this case using relatively light particles with well-defined geometries. The thus separated particles may then be wave coated, where a material such as solder in its molten state selectively wets onto individual metal-coated particles (such as gold-coated spheres) without extensive material bridging. This selective wetting is likely due to the non-random separation pattern of the initial metalized particle.

In the event that a topography is achieved on the surface of the particles other than what is desired, the solder may be reflowed. In that way, an initially-spiked topography may be transformed into a substantially uniform solder coating. This solder reflow may be achieved before or after the solder-coated arrayed particles are transferred onto a substrate bearing metalization.

Prior to contacting the arrayed particles with solder, a fluxing step should desirably be conducted. In such a step, a cleaning and wetting agent (such as rosin in iso-propanol) is contacted with the particles which causes enhanced adhesion of solder to the fluxed particles (or rosin coating, depending on the coating material). The fluxed-particles should be dried prior to subjection to the coating material, such as the solder wave.

Particle separation can be controlled by particle size and concentration, as well as by the concentration of the ferrofluid composition and the stimulation of magnetic field strength. Material coating thickness, particularly in the case of fusible metal alloy coating, can be controlled by initial metalisation on particles, fluxing processes, solder types, dwell time in wave, wave geometry, number of passes through wave, and the like.

Solder preforms with so-called precise solder volumes and dimensions are commercially available and find use herein. Solder spheres, derived from numerous alloys, are a common commercially available preformed product, e.g., Indium Corporation of America, New York, whose spheres have minimum diameters of about 760 microns ±100 microns. Such materials are well-suited for application in solder paste materials for printing in SMT. Bow Solder Products Co., a division of The Canfield Metals Group (New Jersey), also offer commercially a wide variety of solder products, some of which range in diameter from about 125 microns up to several millimeters. Also commercially available from Bow are other types of metal spheres, typically with diameters in the range of several millimeters, from silver, gold, copper, and the like, as well as solder-coated versions of those metal spheres.

A plethora of solder alloys are also known to those persons skilled in the art. Indium-based solders are particularly desirable for use herein where the solder is to be wave-coated over a previously-formed gold coating. Such solders display many advantages, such as enhanced wetting and aging properties.

Many specialized solder alloys are available commercially, such as alloys with-cadmium, copper, gold, indium, tin, silver, antimony, and lead. Such commercial preformed solder spheres are used in solder paste products for SMT and for BGA applications. However, monodisperse solder spheres of any diameter, or solder-coated spheres of diameters less than 100 microns, are not available commercially from Bow and are not believed to be available commercially from any supplier.

The coated, bound, arrayed monolayer particles formed may be subsequently removed from the supporting substrate and used directly on interconnection devices. Alternatively, the bound arrayed particles may be used as a convenient stock on the carrier substrate for metering out well-defined quantities of such particles. Such coated particles may also be brought on their substrate into juxtaposition with electronic devices, such as ICs, during device processing to transfer microscopic deposits of solder onto chip metalisation by reflow. In addition, such coated particles may be used as a convenient substrate stock for subsequent coating, for example, with adhesive. Also, such coated particles may be used for transfer into preformed curable adhesive films for producing high performance ACF-type interconnecting devices containing solder and otherwise modified, uniformly-separated particle stock.

In the methods described herein in which a film-forming material is introduced, the film-forming material may be applied to areas flanking the particle-containing areas. Flanking strips of adhesive, which may be the same adhesive as the adhesive material in the particle-containing areas, are useful for providing extra strength in a conductive adhesive film. Thus, for example, in edge connection to liquid crystal displays, peel strength is a particularly important property to the extent that a flexible connection attached to the display does not peel away during operation.

In certain situations, the film may not need adhesive properties. For example, if the film is to be used between two sets of conductors which are to be assembled temporarily for test purposes but which are not to be bonded. However, generally it is desirable that the film-forming material contains a secondary or latent adhesive/cure system, which is activatable in an end-use application of the film.

Solidification of the film-forming material (and optionally also the curable tack layer composition) generally involves two stages, an A-stage and a B-stage. The A-stage, or primary solidification, has the function of producing a film with the particles maintained in place which is capable of being handled. The A-stage may involve a primary cure, e.g., by photocure, heat, or E-beam. Solvent evaporation, cooling (in particular from a melt), chemical reaction (e.g., polymerization), physical association phenomena and the like are also acceptable means of effecting viscosity increases to an effectively solid A-staged condition.

The source of electromagnetic radiation for effecting cure or polymerization may suitably be any source of electromagnetic heat radiation or particularly actinic radiation, including ultraviolet ("UV"), infra red, visible, X-ray, gamma ray, E-beam or microwave. The time of exposure should be chosen by those persons skilled in the art, depending upon the source of energy, the exposure conditions, the depth of cure desired, the properties of the curable composition (such as, its ability to absorb the chosen energy) and the structure confining the composition. In the case of UV light, an exposure time of about 0.1 to about 1 seconds may suffice.

Desirably, the exposure time should be the minimum required to produce a layer or film of cured material in which the particles are maintained. This layer or film is referred to as the "tack layer", and the tack layer with the particles attached thereto is referred to as the "tacked array", both of which are distinguished from, although may be a part of, the particle containing film, referred to as the "film", which is produced in accordance with the methods of the present invention.

The B-stage which occurs during end-use application of the film may use thermoplastic properties of the A-staged film or coating, but desirably involves a cure, for example, to a thermoset condition. When the A-stage solidification has been effected by a primary cure, the B-stage cure is a secondary cure which may use the same or a different cure mechanism from that of the A-stage.

In the methods described herein, the curable ferrofluid composition may be applied to the substrate, and then exposed to the magnetic field. The composition may be exposed to the magnetic field while the composition is being applied to the substrate. The composition may be applied continuously or in a step-wise manner. Likewise, the substrate may pass continuously or in a step-wise manner past the apparatus applying the magnetic field.

The composition may be applied to the substrate by stenciling or screen printing using stenciling or screen printing equipment having one or more mounted magnets.

The substrate on which the composition may be applied may be rigid or flexible. Examples of appropriate substrates for use herein include, but are not limited to, substrates constructed from polyvinyl alcohols ("PVOH"), polyether sulfones ("PES"), polyesters, and flexible glass-epoxy composites, such as those used in smart-cards, which are UV transparent though are observed to appear optically opaque.

A release layer may form the substrate and/or may be applied to the tack layer in order to prevent the tack layer from bonding with the film-forming material. Similarly, it may be applied to the surface of the film, remote from the substrate, so as to allow for stacking or rolling of the films. The release layer itself may be rigid or flexible or may include a coating or film of an appropriate releasing material.

More specifically, this invention in another aspect relates to methods of forming a coating on a monolayer non-random array of substantive particles. These methods include the steps of applying to a substrate a curable ferrofluid composition, where the curable ferrofluid composition includes a colloidal suspension of ferromagnetic particles in a non-magnetic carrier liquid, and substantive particles, so as to form a monolayer of substantive particles on the substrate; exposing the composition to conditions favorable to at least cure partially a layer of the composition having a thickness of no more than 50% of the height of the largest substantive particles, while the substantive particles are arrayed in a non-random pattern as a result of application of a magnetic field; removing the uncured curable ferrofluid composition; and subjecting the bound non-random arrayed substantive particles to a coating material under conditions favorable to effect coating of the substantive particles.

And in yet another aspect the invention relates to methods of forming a coating on a monolayer non-random array of substantive particles disposed in a film. These methods include the steps of applying to a substrate a curable ferrofluid composition so as to form a monolayer of substantive particles; exposing the curable ferrofluid composition to a source of electromagnetic radiation capable of effecting polymerization of the composition for a sufficient time to effect polymerization of a layer of the composition having a thickness of no more than 50% of the height of the largest substantive particles, while the substantive particles are arrayed in a non-random pattern as a result of application of a magnetic field; and either:

(a) removing the uncured curable ferrofluid composition, if any; subjecting the bound non-random substantive particles to a coating material under conditions favorable to effect coating of the substantive particles; and applying a film-forming material in a liquid state to fill the interstitial spaces between the so-formed array of substantive particles and optionally to cover areas of the substrate flanking the substantive particles to a film thickness similar to that in the substantive particle containing area. Optionally, the film-forming material may be at least partially solidifed; and optionally, the so-formed film may be removed from the substrate; or (b) removing the uncured curable ferrofluid composition, if any; subjecting the bound non-random substantive particles to a coating material under conditions favorable to effect coating of the substantive particles; applying an adhesive film over the surface of the arrayed substantive particles, opposite to the layer of cured composition, with the film having an adhesiveness with respect to the substantive particles greater than that of the cured composition; pressing the adhesive film onto the substantive particles; and separating the adhesive film with the arrayed substantive particles adhered thereto away from the layer of cured ferrofluid composition. Optionally, any substantial amount of uncured or cured curable ferrofluid composition remaining on the adhesive film or on the substantive particles adhered thereto may be removed; optionally, a further film-forming material may be applied to fill the interstitial spaces in the array of substantive particles, and optionally, to cover areas of the adhesive film flanking the substantive particles to a film thickness similar to that in the substantive particle-containing area; and optionally, the further film-forming material may be at least partially solidified.

This composition includes a colloidal suspension of ferromagnetic particles in a non-magnetic carrier liquid, and substantive particles having a particle size on at least one dimension thereof of at least 1 micrometer.

The present invention also relates to monolayered non-random arrays of coated particles and films thereof produced in accordance therewith.

In addition, the invention relates to substrates having a film as described above applied thereto or a film or tacked array of coated particles formed thereon.

And the invention relates to articles having a support tape substrate and non-random monolayer array of coated transferable particles, the particles ranging in size from 1 micrometre to about 500 micrometres and being temporarily bound to the substrate through contact by no more than about 50% of the surface area of the particles. The strength of the bond between the particles and the support tape substrate should be less than the cohesive strength of substantially all of the particles.

The articles may further include an adhesive matrix (curable through at least one cure mechanism), a silicon wafer substrate, an indium-tin oxide ("ITO")-coated glass substrate, or any substrate with a pattern-wise delineation or demarcation of electrical conductors thereon, to which the array of transferable coated particles may adhesively bound, with the strength of the adhesive bond between the substantive particles and the substrate exceeding the strength of the adhesive bond between the substantive particles and the support tape.

The invention is further directed to an article having a support tape substrate, and an ordered monolayer array of coated transferable particles of at least 1 micrometer to about 500 micrometers bound thereto by an adhesive, the adhesive being substantially free of ferromagnetic particles and the adhesive strength of the adhesive being less than the cohesive strength of the particles and being greater to the support tape substrate than to the transferable particles.

The invention is also directed to a method of forming an anisotropic conducting bond between a first and a second set of conductors. The method includes the steps of forming an assembly by applying a first adhesive to a first set of conductors and further applying an article containing a monolayer non-random array of coated particles bound to a support tape substrate to the first set of conductors such that at least some of the non-random monolayer array of coated transferable particles are in contact with the first set of conductors. The first adhesive is then at least partially cured. The support tape is removed with the non-random monolayer array of coated transferable particles adhering to the first set of conductors. A second adhesive, optionally the same as the first adhesive, is applied to the non-random monolayer array of coated transferable substantive particles and a second set of conductors applied to the ordered monolayer array of coated transferable substantive particles. The second adhesive is then activated.

In one embodiment, the first adhesive is UV curable and the support tape is at least partially UV transparent. Other types of adhesives may be used as well as discussed in several of the examples below.

The first set of conductors can occur on a substrate such as an ITO coating on glass, metalization on a semiconductor and metalization on an insulator.

The present invention includes an active or passive electronic component having conductors on its surface or periphery and having a film as described above containing electrically conductive particles applied to its conductors or a film or tacked array formed thereon.

The film or tacked array may be formed on an electrically-addressable substrate, or conductive glass, such as ITO-coated glass which has patternwise-delineated conductive tracks thereon, or, alternatively, may be bound to such substrates by an adhesive. Ceramic, epoxy composite, polyimide films and the like represent other forms of substrates which may include conductive tracks.

In the case of ITO-coated glass substrates, the tack layer of the curable composition is suitably rendered susceptible to photopolymerization, and is cured by irradiation through the transparent substrate, with actinic (or UV) radiation. Exposure conditions may be selected such that only a layer of the curable composition solidifies. After removal of uncured material, a backfilling material is then applied and cured (primary cure or A-stage).

Alternatively, backfilling is not necessary if a film forming material is to be applied intermediate the ITO-coated glass substrate and the substrate to which it is to be mated concurrently with or prior to mating or if the second substrate has a pre-applied coating of a solidifiable film forming material on its surface. The solidifiable film-forming material should either be a liquid or in a softened or pliable state, such that as the substrates are mated and pressed together, the particles penetrate through the solidifiable film forming materials until contact is made with the surface of the second substrate.

Similar methods are appropriate in the case of substrates which are non-transmissive to UV or visible radiation but which are transmissive to other forms of electromagnetic radiation. In such case, the initiator systems in the curable compositions may require modification. Alternatively, a pre-formed "patch" of film according to the invention may be applied to the electrically-addressable substrate. In either case, the backfill composition contains a latent thermal hardener or other B-stage cure system so that it has latent adhesive properties. The resulting products are suitable for use in device interconnection to flat panel displays of various types, or direct die attachment, using FC techniques in the case of a coated and subdivided wafer.

The average particle size of the particles which are to be coated in accordance with this invention should be at least about 10 times that of the colloidal-size ferromagnetic particles, more particularly at least about 100 times, and advantageously at least about 500 times. The substantive particles have an average particle size (measured on the minor dimension in the case of non-symmetrical particles) of at least about 2 micrometres while the colloidal ferromagnetic particles have an average particle size not greater than about 0.1 micrometres, such as about 0.01 micrometres.

For electronic interconnection uses, the interconnection pads generally have a width in the range of about 10 to about 500 micrometres, suitably about 100 micrometres. The separation between the pads generally is less than about 150 micrometres, such as about 100 micrometres. The present invention facilitates pitch or separation reduction below about 100 micrometres, even to about 10 micrometres or less.

The substantive particles should have substantially uniform sizes and shapes. Substantial uniformity is not affected by the presence of smaller than average particles (which may not function as conductive particles in the film) or larger than average particles (which may be compressible and/or otherwise capable of size reduction in the conditions of production of the film or coating).

In the methods described above, the curable composition may be cured or otherwise solidified while the magnetic field is applied or shortly after removal from the field.

Pressure may be applied to the layer of film-forming material before and/or during the primary curing or other solidification step.

The particles may be compliant when pressed upon, either during preparation of the film, or during its end-use application. Such compliancy facilitates greater than single point contact and enables compensations for small variations in particle size or substrate flatness. This is particularly desirable in the preparation of electrically-conductive films.

The thickness of the film should be substantially the same as the average diameter of the substantive particles. In the event the particles are of two or more groups of different sizes, particles belonging to the group of larger particles should be of substantially uniform size and the thickness of the film should be in relation to the average diameter of that largest group of particles. During exposure to the magnetic field, the thickness of the layer of curable ferrofluid composition may be greater than the average diameter of the substantive particles, although ordinarily the thickness should be less than twice the average diameter. In this way, each particle may be surrounded by the carrier liquid and may migrate in the layer of the composition.

After backfilling, pressure may be applied to the material to reduce the thickness so that the substantive particles lie at, or protrude slightly from, both surfaces of the film. Alternatively, the thickness of the film may be reduced by shrinkage during the A-stage, e.g., as a result of cure or drying.

If the particles are compressible spheres, the thickness of the film may be reduced by compression to less than the average diameter of the electrically-conductive particles. In so doing, the particles may be compressed into a non-circular cross-sectional shape and the area of electrical contact on the surface of each particle thereby increased. Compression of individual particles to different degrees of compression may also compensate for some variations in particle size and flatness of the substrate. The compressibility of electrically-conductive particles having a core of polymeric material coated with an electrically-conductive metal will be of a degree dependent upon the extent of cross-linking of the polymer.

Generally, the uniform magnetic field is applied normal to the layer of the curable composition (i.e., in the Z direction) and the substantive particles form a regular array of particles in a monolayer. With a monolayer, there is primarily single-particle bridging in the Z direction between two sets of conductors (when the film is used between two sets of conductors). The regular pattern improves the reliability of electrical contact. The magnetic field may be applied parallel to the layer of the curable composition (e.g., the X direction) and the particles form parallel chains of particles, each in contact with an adjacent particle or particles of the same chain. The chains are formed to lie parallel to the longitudinal axis of two sets of conductor pins or tracks. Here again, single-particle bridging in the Z-direction may be achieved between the two sets of conductors. The particles, however, are also in electrical contact with adjacent particles in the same chain so that reliability is further improved.

In the methods described herein, the curable ferrofluid composition may include a colloidal dispersion of ferromagnetic particles in a curable liquid composition (i.e., the curable composition acts as the carrier of the ferrofluid); or a mixture of a curable liquid composition and a colloidal dispersion of ferromagnetic particles in a liquid carrier.

The colloidal ferromagnetic particles of the ferrofluid may be magnetite, or other ferromagnetic particles, such as those described in U.S. Pat. No. 4,946,613 (Ishikawa), the disclosure of which is hereby expressly incorporated herein by reference. Examples of suitable ferromagnetic particles include ferromagnetic oxides, such as manganese ferrites other than magnetite, cobalt ferrites, barium ferrites, metallic composite ferrites (e.g., zinc, nickel and mixtures thereof), and mixtures thereof; and ferromagnetic metals, such as iron, cobalt, rare earth metals, and mixtures thereof. A ferrite is a ceramic iron oxide compound having ferromagnetic properties with a general formula $MFe_2O_4$ where M is generally a metal, such as cobalt, nickel or zinc [see Chambers Science and Technology Dictionary, W. R. Chambers Ltd. and Cambridge University Press, England (1988)]. The phenomenon of ferromagnetism is observed in ferrites and similar materials.

The diameter of the ferromagnetic particle diameter may be in the range of about 2 nanometres to 0.1 micrometres, with a mean particle size of about 0.01 micrometres. The ferromagnetic particle content may be in the range of about 1 to about 30% by volume of the curable ferrofluid composition. In the case where a monomer forms the carrier of the ferrofluid, the suspension of ferromagnetic particles in the monomer may have a particle content of from about 2 to about 10% by volume.

A surfactant may generally be used to produce stable dispersions of the ferromagnetic particles in the carrier, particularly in curable carriers. Surfactants may be selected from unsaturated fatty acids and salts thereof, where the fatty acid or salt has one or more polar groups such as $COOH$, $SO_3H$, $PO_3H$ and mixtures thereof. Other surfactants well known in the art such as silicone-type surfactants, fluorine-type surfactants and the like, may also be used. Suitable surfactants include sodium oleate, oleic acid, and silane coupling agents, such as those available under the trademark SH-6040 from Toray Silicone Co. Ltd.; Saloosinate LH from Nikko Chem. Co. Ltd; and the fluorine-containing surfactant X C95-470 from Toshiba Silicone Co. Ltd.

Primary surfactants form an adsorbed coating on the surface of the ferromagnetic particles. A secondary surfactant may also be used, to achieve dispersability, particularly an anionic surfactant, for example an acid form of a phosphate ester, particularly an aromatic phosphate ester type surfactant, such as GAFAC RE610 from GAF (Great Britain) Limited, Wythenshawe, Manchester, U.K. or RHODAFAC RE610 from Rhone-Poulenc, Chimie, France.

Conventional ferrofluid compositions include colloids of the ferromagnetic particles in a suitable non-magnetic carrier liquid. Such non-magnetic carrier liquids may be chosen from among those described in U.S. Pat. No. 4,946,613 (Ishikawa), U.S. Pat. No. 3,843,540 (Reimers) and International Patent Application WO 95/20820, the disclosures of each of which are hereby expressly incorporated herein by reference.

The carrier liquid may be an organic solvent selected from (a) hydrocarbons, such as kerosene and fuel oils, n-pentane, cyclohexane, petroleum ether, petroleum benzine, benzene, xylene, toluene and mixtures thereof; (b) halogenated hydrocarbons, such as chlorobenzene, dichlorobenzene, bromobenzene and mixtures thereof; (c) alcohols, such as methanol, ethanol, n-propanol, n-butanol, isobutanol, benzylalcohol and mixtures thereof; (d) ethers such as diethyl ether, diisopropyl ether and mixtures thereof; (e) aldehydes, such as furfural and mixtures thereof; (f) ketones, such as acetone, ethyl methyl ketone and mixtures thereof; (g) fatty acids such as acetic acid, acetic anhydride and mixtures thereof and derivatives thereof; and (h) phenols, as well as mixtures of the various solvents.

Commercially available ferrofluids, such as those from Ferrofluidics Corp., New Hampshire, USA, include dispersed magnetizable particles in suitable carriers, such as water, esters, fluorocarbons, polyphenylethers and hydrocarbons. For a more detailed discussion of ferrofluids, see e.g., E. Wyn-Jones et al., Ferromagnetic Materials, Vol. 2, Ch. 8, p. 509, North Holland Publishing Co., E. P. Wohlfarth ed. (1980); Aggregation Processes in Solution, Ch. 18, p. 509, Elsevier Sci. Publishing Co. (1983); and R. E. Rosensweig, *Ann. Rev. Fluid Mech.*, 19, 437–63 (1987).

The curable ferrofluid composition may be an adhesive composition. More specifically, it may be any suitable monomer composition into which the colloidal ferrofluid can be mixed or in which the ferromagnetic particles can be dispersed to form a colloid. A wide variety of polymerizable systems, based on acrylate, epoxide, siloxane, vinyl ether and other monomers, oligomers, prepolymers such as polyimides and cyanate ester resins and/or polymers and hybrids thereof, may be used as the curable tack layer composition and/or as the film-forming material. Conventional ACFs have been described in International Patent Application WO 93/01248, based on cyanate ester resins in conjunction with thermoplastic resin additives. The adhesive may be selected from olefinically unsaturated systems, such as acrylates, methacrylates, styrene, maleate esters, fumarate esters, unsaturated polyester resins, alkyl resins, thiol-ene compositions, and acrylate methacrylate or vinyl-terminated resins, such as silicones and urethanes.

Suitable acrylates and methacrylates are those used in polymerizable systems, such as those disclosed in U.S. Pat. No. 4,963,220 (Bachmann) and U.S. Pat. No. 4,215,209 (Ray-Chaudhuri). Other acrylate-containing materials useful herein are methylmethacrylate, polyfunctional methacrylates, silicone diacrylates and polyfunctional acrylated urethanes of the type known to be useful in formulating adhesives [e.g., as disclosed in U.S. Pat. No. 4,092,376 (Douek)] or thiol-ene or thiol-nene materials (e.g., as disclosed in U.S. Pat. Nos. 3,661,744, 3,898,349, 4,008,341 (Kehr) and U.S. Pat. No. 4,808,638 (Steinkraus), the disclosures of each of which are hereby expressly incorporated herein by reference].

Suitable epoxy systems are included among those described in F. T. Shaw, "Chemistry and Technology of Epoxy Resins", 7, 206ff, B. Ellis, ed., Blackie Academic and Professional, London (1993), the disclosure of which is hereby expressly incorporated herein by reference.

In the case where the solidification process involves the resolidification of a molten matrix material, suitable matrices include polyamide hot melt adhesive polymers, such as UNI-REZ 2642 and UNI-REZ 2665 (commercially available from Union Camp Corporation, Savannah, Ga.), and polyester polymers, such as VITEL 1870 and VITEL 3300 (commercial available from Shell Chemical Co., Akron, Ohio).

The adhesive system for the tack layer should either be compatible with a commercially available ferrofluid or be capable of acting as a carrier for the suitably treated magnetically polarizable particles which are used in the making of a ferrofluid.

The curable tack layer composition, like the film-forming composition, may be one that undergoes a one-step or two-step cure or solidification (or is reversibly solidifiable). In the first step, the tack layer is sufficient to bond and maintain in place the particles. In the second step, particularly where it is desired to adhere the so-formed tacked array or film to a substrate, a full cure or solidification or resolidification is attained. Such a result may be achieved with curable compositions, which include two or more polymerizable systems, a primary cure system and a secondary or latent cure system, or monomers which have two or more reactive or functional groups thereon, e.g., an epoxy and acrylate.

Suitable solidifiable backfilling or film-forming materials may be organic or inorganic, and solidification may occur through a variety of mechanisms. Desirable backfilling materials are organic, such as thermosets or thermoplastics, the latter of which include conventional "commodity" thermoplastics, such as polyolefins, polystyrene and polyvinylchloride, as well as "engineered" thermoplastics, such as polyalkylene terephthalates, polycarbonates, polyetherimides, polyphenylene ethers, polyetheretherketones, and the like. Thermoset materials include, but are not limited to, those materials discussed above as suitable for the tack layer, save the ferrofluid or ferromagnetic particles. Cure or polymerization of the film-forming materials may occur through free radical, anaerobic, photoactivated, air-activated, heat-activated, moisture-activated, instant or other cure systems, such as the addition of hardeners to resins. In addition, one cure system may be used in the A-stage or primary solidification, and a second, distinct cure system may be used in the B-stage. Those persons skilled in the art should recognize that other curable or solidifiable monomers, oligomers, pre-polymers and polymer materials and systems may be employed as the film-forming material.

Backfilling may be accomplished by pouring, dispensing or wave coating the film-forming material onto the tacked layer or the adhesive film. Additionally, backfilling may be accomplished by squeegeeing the film-forming material onto the tacked layer or adhesive film. Alternatively, backfilling may be accomplished by pressing together a carrier film or substrate having a layer of film-forming material disposed thereon and a tacked array or an adhesive film with the particles disposed thereon. The film-forming material should be in a liquid or readily penetrable state. In this way, the particles may penetrate to a depth of at least about 50% of the height of the largest particles, such as least about 95% of the height of the largest particles. For backfilling, the layer of film forming material is desirably less than about 125% of the height of the largest particle and desirably of a thickness within the range of from about 95% to about 110% of the height of the largest particle, such as from about 95% to about 100% of the height of the largest particle. These ratios may vary depending upon the depth to which the articles penetrate the tack layer or adhesive film.

After cure or A-stage cure, the carrier film or substrate may be removed. Alternatively, the carrier film or substrate may be removed just prior to use of the so-formed film in its intended end-use application.

The monomer composition of which the ferrofluid is comprised may include two polymerizable systems, one of which cures wholly or partially in the A-stage or primary solidification, and the second of which cures in the B-stage (accompanied by further curing of the first system, if appropriate). Alternatively or additionally, the monomers themselves may be hybrids having more than one reactive or curable functionality, such as an epoxy acrylate.

Application of a magnetic field to the ferrofluid composition creates interactions between the colloidal ferromagnetic particles and the non-magnetic substantive particles. These interactions result in mutual stabilization in a non-random structural pattern (with chain formation where the appropriate dimension of a layer of the composition so permits) due to attractive interactions between particles and repulsive interaction between chains [see Skjeltorp, "One- and Two-Dimensional Crystallization of Magnetic Holes", *Phys. Rev. Lett.*, 51(25), 2306–09 (Dec. 19, 1983)].

The concentration of particles in the composition should be chosen according to the desired spacing between those particles in the ordered array and other factors. With spherical particles of about 2 micrometres diameter, a concentration in a monolayer of about $10^7$ particles per square centimetre may be suitable. A qualitative concentration in the range 0.5–60%, by weight of the composition may also be suitable [see U.S. Pat. No. 5,366,140 (Koskenmaki), the disclosure of which is hereby expressly incorporated herein by reference].

Desirable concentrations of substantive particles depend upon factors that may be determined by those persons skilled in the art through routine experimentation and/or mathematical calculations. See U.S. Pat. No. 4,846,988 (Skjeltorp) (concentration of magnetic holes in ferrofluids polarized with a magnetic field, determines the distance between them); Shiozawa et.al., 1st International Conference on Adhesive Joining Technology in Electronics Manufacturing, Berlin (November 1994) (contact resistance in traditional anisotropically conductive adhesives decreases as particle count (per unit area) increases). An increasing number of conductive particles increases the current carrying capacity. The current carrying capabilities are not only concentration dependent, but also particle-type dependent [see Lyons and Dahringer, in *Handbook of Adh. Tech.*, p. 578, Marcel Dekker Inc., Pizzi and Mittal, eds. (1994)]. Indeed, such current carrying capability should be enhanced if presently commercially-available metal-plated particles (such as those from Sekiusi or Dyno) are further coated with a material, such as solder, by the methods of this invention.

Accordingly, the concentration of conductive particles should depend on the particle type, density, diameter, electrical pattern, minimum required contact resistance measurements, the spacing between opposing and adjacent conductors, the surface area of the conductors and the like.

Li and Morris, 1*st Int'l Conf. on Adh. Joining Tech. in Elec. Manuf'g* (Berlin) (November 1994) describe computer programs which calculate the minimum pad size for different loading densities and the minimum pad space for different particle sizes of conductive particles in conductive adhesives. In ordering the array of particles, a magnetic field may be applied by a permanent magnet or by a source of electromagnetism.

The magnetic field is described therein to be in the range of 10 mT to 1000 mT, such as 10 mT to 100 mT, applied for a period of time within the range of 0.1 to 10 minutes, such as 0.5 to 5 minutes. Such a level of magnetization is appropriate for use with the methods of the present invention. The magnetization saturation of the ferrofluid composition should influence the selection of the magnetic field strength.

Films or coatings according to the present invention containing electrically-conductive particles are intended for use in electrical interconnection of active and/or passive electronic components, for example chip-on-board ("COB"), chip-on-flex ("COF"), chip-on-glass ("COG") and board/flex and flex/glass. The invention is particularly well suited for interconnection of fine-pitch sets of conductors and for FC technology.

The invention also provides a method of making an assembly of two components which includes forming a monolayer of particles in a cured layer of curable composition according to certain of the methods described above, bringing the second component into contact with the coated particles, and applying a fluid adhesive material into the space between the components and optionally over the assembly. The method is particularly suitable for forming a "globbed" assembly of an electronic device onto a substrate such as a board. The cured tack layer with the particles arrayed therein is created on the substrate and the device is assembled onto the particle array. It may optionally be held in position by a "chipbonder" adhesive in small quantities, or the particles themselves may have adhesive properties, such as is described in the WO '820 application. The assembly may then be globbed and underfilled simultaneously by applying adhesive over the device and into the space between the two components including the interstitial space between the particles. This method maximizes electrical contact and environmental protection for the particles. Desirable examples of underfill adhesives which may be used as described herein include those described in U.S. Pat. Nos. 5,512,613 and 5,560,934 (Afzali-Ardakani); U.S. Pat. No. 5,430,112 (Sakata); Japanese Patent Application No. JP 6571/9, and Irish Patent Application No. IR 980028, the disclosures of each of which are hereby incorporated herein by reference.

The following examples are intended to further illustrate certain of the benefits and advantages of the present invention.

EXAMPLES

In the Examples, the following abbreviations are used: Ms=Magnetization saturation; G=Gauss; T=Tesla; and mPa·s=($10^{-3}$Nm$^{-2}$s)=Centipoise ("cps") .

Example 1

Gold-coated microspheres of divinylbenzene-crosslinked polystyrene having a diameter of 18 microns (standard deviation of diameter variation is 0.6 microns) which were previously treated a nickel seed layer (commercially available under the trademark MICROPEARL from Sekisui KK, Japan) were admixed at a 10% wt/wt loading with a polymerisable ferrofluid system. The ferrofluid system was prepared from about 70% wt/wt of ferrofluid APG511A (commercially available from Ferrofluidics Corp., New Hampshire, with a Ms of ~200 G and a room temperature viscosity of approximately 40 mPa·s), 20% wt/wt acrylic acid and 10% wt/wt of a photoinitiator available commercially as IC 1700 (Ciba Geigy, UK).

Of course, other monomers, photoinitiator and ferrofluids may be used, provided the components reach a one-phase colloidal suspension. Examples of other ferrofluid formulations, together with their magnetization saturation (Ms) and room temperature viscosity characteristics, are set forth in the tables below:

Type I Formulations

| Formulation | Composition % w/w | Characteristics |
| --- | --- | --- |

| Sample No. | APG511A | APG513A | Acrylic Acid | ICI700 | KR-55 | Ms (G) | (mPa · s) @ RT |
|---|---|---|---|---|---|---|---|
| 1 | 75 | — | 10 | 10 | 5 | 150 | 30 |
| 2 | 60 | — | 20 | 15 | 5 | 120 | 24 |
| 3 | 50 | — | 30 | 15 | 5 | 100 | 20 |
| 4 | — | 60 | 20 | 15 | 5 | 240 | 90 |
| 5 | — | 50 | 30 | 15 | 5 | 200 | 75 |
| 6 | — | 40 | 30 | 20 | 10 | 160 | 60 |

APG511A and APG513A are ferrofluid products available from Ferrofluidics Inc.

Type II Formulations

| | Formulation Composition % w/w | | | | | | Characteristics | |
|---|---|---|---|---|---|---|---|---|
| Sample No. | LOC249 | LOC259 | HDDA | Acrylic Acid | ICI700 | KR-55 | Ms (G) | (mPa · s) @ RT |
| 7 | 70 | — | — | 20 | 10 | — | 95 | 18 |
| 8 | 60 | — | 10 | 15 | 10 | 5 | 81 | 15 |
| 9 | 80 | — | — | 10 | 10 | — | 108 | 20 |
| 10 | — | 50 | 30 | 10 | 10 | — | 148 | 35 |
| 11 | — | 60 | — | 17.5 | 12.5 | 10 | 177 | 42 |
| 12 | — | 40 | 25 | 20 | 10 | 5 | 118 | 28 |

LOC 249 and 259 are custom ferroadhesives prepared in hexanediol diacrylate (HDDA) polymerizable carriers.

These formulations may be classified for the sake of reference into two general classes—those in which the conventional ferrofluids are themselves not polymerisable, but are formulated with various levels and types of monomer(s) which are polymerisable (Type I), and those derived from 100% polymerisable ferrofluid carriers (Type II). In each case the formulations contained various levels of initiator systems, such as a photoinitiator (IC 1700). The formulations may further contain specialized adhesion promoters for specific substrates. For example, KR-55 is an adhesion promoter (available commercially from Kennrich Petrochemicals, Inc., NJ), which is compatible with ferrocolloids of either Type I or II.

Particles of different sizes, types as well as with different concentrations of particles have also been prepared into ACAs and ACFs. Thus, for example, 7 micron gold-coated crosslinked polystyrene spheres at 15% w/w were maintained in arrays on the surface of a thin cured ferroadhesive. Non-conductive 25 micron uncoated polystyrene spheres were similarly adhered to the surfaces, as were 15 micron regular hexagonal zeolite crystals. These non-random arrayed monolayers of particles (irrespective of the core material from which the particle was made or the geometry of the particle itself) may also be coated with a material according to the methods of this invention, with those persons of ordinary skill in the art understanding that appropriate choices for coating conditions, materials and the like may have to be made.

The mixture was applied as a liquid film to a PVOH-type film substrate (commercially available under the trademark SCOTCH MASK PLUS II from 3M Industrial Tape Division, St Paul, Minn.). A PES-type film substrate (commercially available from Goodfellow Metals, Cambridge, UK) was also used for this purpose. A temporary laminate was formed by applying a second substrate (here, a 75 micron thick polyester substrate) over the liquid film.

The thus sandwiched liquid film was pulled through a uniform magnetic field (0.6 T) disposed orthogonally to the horizontal laminate plane. The rate of transverse through the field was about 2–5 cm/sec. The sandwiched liquid film was then exposed to UV light (at a wavelength of 366 nm) for about 0.2–0.3 seconds from the PVOH substrate side. The laminate was next split apart by a peeling action and the PVOH substrate was washed with methylethyl ketone.

Inspection of the PVOH substrate on the optical microscope revealed an array of uniformly separated microparticles, which appeared as gold spheres when observed in reflection mode. These spheres were secured by a thin layer of polymerized ferrofluid which in turn was overcoated on the PVOH substrate. Electron microscopy revealed that the polymerized ferrofluid layer appeared to have a thickness of about 1.5 microns.

The substrate supporting the monolayer array of gold particles was mounted upside down on a sample carriage holder so that the particles faced downwards.

This arrayed particle-bearing substrate was then passed through a foamed flux wave derived from rosin-like materials solvated in isopropyl alcohol (commercially available under the tradename Flux RL8, from Frys Metal Ltd, UK) at room temperature at a rate of about 2–5 cm/sec. The so-fluxed substrate was dried over a hot plate positioned between the fluxing station and the soldering station. The drying time was about 30 seconds at a temperature of about 100° C. Next, the fluxed, arrayed particle-bearing substrate was passed across a wave of 63–37 standard tin-lead solder at a temperature of about 243° C. at a rate of about 5 cm/sec using a benchtop wave soldering machine (Soldermatic Super Midget Model SM400, Soldermatic Equipment, Surrey, UK).

Inspection of the solder-coated particle arrayed-bearing substrate under the optical microscope revealed that the array of gold spheres had now taken on a bright silver appearance. No residual quantities of solder was observed between particles. Particle bridging by solder was observed to occur rarely over many particles. Backscatter in electron microscopy confirmed that the particles were coated with solder alloy.

Example 2

In this example, an evaluation was undertaken to ascertain angle preference at which to present the particle array-bearing substrates to the molten solder front. This was performed by immersing substrates prepared similarly to those in Example 1 (but further clipped onto a glass slide for support) into molten solder baths after fluxing.

Upon withdrawing the substrates from the molten solder bath, inspection revealed that spikelike features could be built up on the particles which were controlled by dip direction and dwell time within the bath. Examples of coated, arrayed and spiked particles are illustrated in electron micrographs shown as FIG. 1.

While the invention is described herein in terms of application in the electronics industry, it is not meant to be so limited since particles suitably modified with various coatings find applications in other industries, such as in the biomedical and photonics/optical industries. And while the invention has been illustratively described herein with reference to various desirable features, aspects and embodiments, it will be appreciated that the invention is not thus limited, and may be widely varied in respect of alternative variations, modifications, and other embodiments, and therefore the invention is to be broadly construed as including such alternative variations, modifications, and other embodiments, within the spirit and scope of the invention as claimed.

What is claimed is:

1. A method of coating substantive particles, said method comprising the steps of:
   (a) applying a curable ferrofluid composition to a substrate so as to form a film with a thickness of less than two substantive particle diameters, wherein the curable ferrofluid composition comprises:
      (i) a colloidal suspension of ferromagnetic particles in a non-magnetic carrier liquid, and
      (ii) substantive particles;
   (b) subjecting the film of (a) to a magnetic field for a time sufficient to array the substantive particles in the film in a non-random pattern;
   (c) exposing the magnetic field-stimulated film of (b) to conditions favorable to at least cure partially the film and bond the substantive particles to the substrate;
   (d) removing uncured curable ferrofluid composition; and
   (e) subjecting the bound non-random arrayed substantive particles of (c) to a coating material under conditions favorable to effect coating of the substantive particles.

2. The method according to claim 1 wherein the coating material in step (e) is a material capable of liquifying at temperatures greater than about 150° C. selected from the group consisting of fusible metal alloys, thermoplasts, reactive hot melt materials, epoxies, cyanate esters, polyimides, polyamides, polyesters, and appropriate combinations thereof.

3. The method according to claim 1, wherein the coating material in step (e) is a fusible metal alloy.

4. The method according to claim 1, wherein the coating material in step (e) is solder.

5. The method according to claim 4, further comprising between step (d) and step (e), the step of (d)(i) fluxing the bound non-random arranged substantive particles.

6. The method according to claim 5, further comprising between step (d)(i) and step (e) the step of (d)(ii) drying the fluxed, bound non-random arranged substantive particles.

7. The method according to claim 1, wherein the non-random array monolayer of substantive particles is an ordered array.

8. The method according to claim 1, wherein the substrate is constructed from a material which transmits electromagnetic radiation, is substantially flexible and is resistant to thermal degradation at elevated temperature conditions.

9. The method according to claim 6, wherein the substantive particles are metal-coated particles.

10. The method according to claim 6, wherein the substantive particles are gold-coated polymer spheres.

11. The method according to claim 10, wherein the gold-coated polymer spheres have a particle size within the range of about 5 microns to about 1000 microns.

12. A method of forming a coating on a monolayer non-random array of substantive particles, said method comprising the steps of:
   (a) applying to a substrate a curable ferrofluid composition to form a monolayer of substantive particles thereon, wherein the curable ferrofluid composition comprises:
      (i) a colloidal suspension of ferromagnetic particles in a non-magnetic carrier liquid, and
      (ii) substantive particles,
   (b) exposing the composition to conditions favorable to at least cure partially a layer of the composition having a thickness of no more than 50% of the height of the largest substantive particles, while the substantive particles are arrayed in a non-random pattern as a result of application of a magnetic field;
   (c) removing the uncured curable ferrofluid composition; and
   (d) subjecting the bound non-random arrayed substantive particles of (b) to a coating material under conditions favorable to effect coating of the substantive particles.

13. A method of forming a coating on a monolayer non-random array of substantive particles disposed in a film, said method comprising the steps of:
   (a) applying to a substrate a curable ferrofluid composition, comprising a colloidal suspension of ferromagnetic particles in a non-magnetic carrier liquid, and substantive particles having a particle size on at least one dimension thereof of at least 1 micrometer, so as to form a monolayer of substantive particles;
   (b) exposing the curable ferrofluid composition of (a) to a source of electromagnetic radiation capable of energy suitable for effecting polymerization of the composition for a sufficient time to effect polymerization of a layer of the composition having a thickness of no more than 50% of the height of the largest substantive particles, while the substantive particles are arrayed in a non-random pattern as a result of application of a magnetic field; and either
   (I) (c) removing the uncured curable ferrofluid composition, if any;
   (d) subjecting the bound non-random substantive particles of (b) to a coating material under conditions favorable to effect coating of the substantive particles;
   (e) applying a film-forming material in a liquid state to fill the interstitial spaces between the so-formed array of substantive particles and optionally to cover areas of the substrate flanking the substantive particles to a film thickness similar to that in the substantive particle containing area;
   (f) optionally, at least partially solidifying the film-forming material; and
   (g) optionally, removing the so-formed film from the substrate; or (II) (c) removing the uncured curable ferrofluid composition, if any;

(d) subjecting the bound non-random substantive particles of (b) to a coating material under conditions favorable to effect coating of the substantive particles;

(e) applying an adhesive film over the surface of the arrayed substantive particles, opposite to the layer of cured composition, said film having an adhesiveness with respect to the substantive particles greater than that of the cured composition;

(f) pressing the adhesive film onto the substantive particles;

(g) separating the adhesive film with the arrayed substantive particles adhered thereto away from the layer of cured ferrofluid composition;

(h) optionally, removing any substantial amount of uncured or cured curable ferrofluid composition remaining on the adhesive film or on the substantive particles adhered thereto;

(i) optionally, applying a further film-forming material to fill the interstitial spaces in the array of substantive particles and, optionally, to cover areas of the adhesive film flanking the substantive particles to a film thickness similar to that in the substantive particle-containing area; and (j) optionally, at least partially solidifying the film-forming material.

14. The method according claim 1, wherein the curable composition or curable ferrofluid composition is applied to the substrate in a pattern.

15. The method according to claim 1, wherein the curable composition or curable ferrofluid composition is applied by screen or stencil printing.

16. The method according to claim 13, wherein the film-forming material(s) is(are) selected from thermosets and thermoplastics.

* * * * *